(12) United States Patent
Lindsey et al.

(10) Patent No.: US 12,217,583 B2
(45) Date of Patent: *Feb. 4, 2025

(54) DEVICES, SYSTEMS, AND METHODS FOR REMOTE VIDEO RETRIEVAL

(71) Applicant: LiveView Technologies, LLC, Orem, UT (US)

(72) Inventors: Steven R. Lindsey, Orem, UT (US); Skyler J. Call, Lehi, UT (US)

(73) Assignee: LiveView Technologies, LLC, American Fork, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,966

(22) Filed: Aug. 29, 2022

(65) Prior Publication Data

US 2022/0415147 A1    Dec. 29, 2022

Related U.S. Application Data

(63) Continuation of application No. 16/867,316, filed on May 5, 2020, now Pat. No. 11,495,102, which is a
(Continued)

(51) Int. Cl.
*G08B 13/196*  (2006.01)
*H01L 29/40*   (2006.01)
(Continued)

(52) U.S. Cl.
CPC .  *G08B 13/19673* (2013.01); *G08B 13/19656* (2013.01); *G08B 13/19669* (2013.01);
(Continued)

(58) Field of Classification Search
None
See application file for complete search history.

(56) References Cited

U.S. PATENT DOCUMENTS 6,005,678 A   12/1999  Higashida et al.
6,097,429 A    8/2000  Seeley et al.
(Continued)

FOREIGN PATENT DOCUMENTS

CN         103559781 A    2/2014
KR     10-2011-0023634 A    3/2011
WO        2009/088265 A2    7/2009

OTHER PUBLICATIONS

International Search Report and Written Opinion received in application No. PCT/US15/43669, dated Jan. 11, 2016, 8 pgs.
(Continued)

*Primary Examiner* — Stefan Gadomski
(74) *Attorney, Agent, or Firm* — TraskBritt

(57) ABSTRACT

Methods and systems provided. A system may include at least one camera at a camera location, wherein the at least one camera is configured to record one or more videos and one or more images. The system may further include a server. The server may be configure to download at least one image of the one or more images captured at the camera location. The server may also be configured to display the one or more downloaded images. Further, the server may also be configured to, in response to a user selecting a displayed image of the one or more displayed images, download a specific portion of the previously recorded one or more videos captured at the camera location.

20 Claims, 7 Drawing Sheets

Related U.S. Application Data continuation-in-part of application No. 14/451,067, filed on Aug. 4, 2014, now Pat. No. 10,645,459.

(51) Int. Cl.
   *H01L 29/423* (2006.01)
   *H04N 5/77* (2006.01)

(52) U.S. Cl.
   CPC .......... *H01L 29/401* (2013.01); *H01L 29/407* (2013.01); *H01L 29/4236* (2013.01); *H04N 5/77* (2013.01)

(56) References Cited

U.S. PATENT DOCUMENTS

| | | | |
|---|---|---|---|
| 6,323,897 B1* | 11/2001 | Kogane | G08B 13/19634 |
| | | | 348/E7.086 |
| 6,693,530 B1 | 2/2004 | Dowens et al. | |
| 6,891,566 B2 | 5/2005 | Marchese | |
| 7,000,242 B1 | 2/2006 | Haber | |
| 7,110,025 B1 | 9/2006 | Loui et al. | |
| 7,540,011 B2 | 5/2009 | Wixson et al. | |
| 7,543,327 B1 | 6/2009 | Kaplinsky | |
| 7,639,943 B1 | 12/2009 | Kalajan | |
| 7,792,256 B1 | 9/2010 | Arledge et al. | |
| 8,098,281 B1 | 1/2012 | Croak et al. | |
| 8,350,694 B1 | 1/2013 | Trundle et al. | |
| 8,644,702 B1 | 2/2014 | Kalajan | |
| 8,792,563 B2 | 7/2014 | Yova et al. | |
| 8,914,526 B1 | 12/2014 | Lindquist et al. | |
| 9,143,670 B1 | 9/2015 | Cilia | |
| 9,246,915 B2* | 1/2016 | Springer | H04L 67/561 |
| 9,583,012 B1 | 2/2017 | Loftis et al. | |
| 9,860,517 B1 | 1/2018 | Ramaswamy et al. | |
| 10,645,459 B2 | 5/2020 | Lindsey et al. | |
| 11,202,003 B1 | 12/2021 | Tanner | |
| 2002/0003575 A1 | 1/2002 | Marchese | |
| 2002/0016971 A1* | 2/2002 | Berezowski | G11B 27/105 |
| | | | 348/E7.071 |
| 2002/0133486 A1 | 9/2002 | Yanagihara et al. | |
| 2002/0175917 A1 | 11/2002 | Chakravarty et al. | |
| 2002/0175995 A1 | 11/2002 | Sleeckx | |
| 2002/0178272 A1 | 11/2002 | Igarashi et al. | |
| 2003/0025599 A1 | 2/2003 | Monroe | |
| 2004/0003151 A1 | 1/2004 | Bateman et al. | |
| 2004/0095396 A1 | 5/2004 | Stavely et al. | |
| 2004/0146272 A1 | 7/2004 | Kessel et al. | |
| 2005/0022245 A1 | 1/2005 | Nallur et al. | |
| 2005/0174229 A1 | 8/2005 | Feldkamp et al. | |
| 2006/0136972 A1 | 6/2006 | Metzger et al. | |
| 2006/0174302 A1 | 8/2006 | Mattern et al. | |
| 2006/0195876 A1* | 8/2006 | Calisa | H04N 23/661 |
| | | | 348/E7.086 |
| 2006/0279628 A1 | 12/2006 | Fleming | |
| 2007/0205888 A1 | 9/2007 | Lee et al. | |
| 2008/0016541 A1* | 1/2008 | Murakami | H04N 21/2187 |
| | | | 725/114 |
| 2008/0043108 A1 | 2/2008 | Jung et al. | |
| 2008/0097970 A1 | 4/2008 | Olstad et al. | |
| 2008/0122929 A1 | 5/2008 | Chukwu | |
| 2008/0303903 A1 | 12/2008 | Bentley et al. | |
| 2009/0009605 A1 | 1/2009 | Ortiz | |
| 2009/0027495 A1 | 1/2009 | Oskin et al. | |
| 2009/0046211 A1 | 2/2009 | Maekawa et al. | |
| 2009/0138906 A1 | 5/2009 | Eide et al. | |
| 2009/0195655 A1 | 8/2009 | Pandey | |
| 2009/0237528 A1 | 9/2009 | Kawamura et al. | |
| 2010/0008649 A1 | 1/2010 | Watanabe et al. | |
| 2010/0050124 A1 | 2/2010 | Douillet et al. | |
| 2010/0074590 A1 | 3/2010 | Momosaki | |
| 2010/0104146 A1 | 4/2010 | Momosaki | |
| 2010/0128987 A1 | 5/2010 | Mcafee et al. | |
| 2010/0274820 A1 | 10/2010 | O'Brien et al. | |
| 2011/0055765 A1 | 3/2011 | Neubrand et al. | |
| 2011/0080940 A1 | 4/2011 | Bocharov et al. | |
| 2011/0128150 A1 | 6/2011 | Kanga et al. | |
| 2011/0128382 A1* | 6/2011 | Pennington | G07F 17/3241 |
| | | | 348/E7.085 |
| 2011/0221913 A1 | 9/2011 | Nagai et al. | |
| 2011/0293246 A1 | 12/2011 | Selvarajan et al. | |
| 2011/0299835 A1 | 12/2011 | Fleming | |
| 2012/0110317 A1 | 5/2012 | Scheer et al. | |
| 2012/0213493 A1 | 8/2012 | Luo et al. | |
| 2012/0300081 A1 | 11/2012 | Kim | |
| 2012/0324359 A1 | 12/2012 | Lee et al. | |
| 2013/0016213 A1 | 1/2013 | Yova et al. | |
| 2013/0036233 A1 | 2/2013 | Orleth | |
| 2013/0039634 A1* | 2/2013 | M | G08B 13/19682 |
| | | | 386/230 |
| 2013/0080895 A1 | 3/2013 | Rossman et al. | |
| 2013/0091432 A1 | 4/2013 | Shet et al. | |
| 2013/0093896 A1* | 4/2013 | Jeon | G08B 13/19697 |
| | | | 348/152 |
| 2013/0101220 A1 | 4/2013 | Bosworth et al. | |
| 2013/0117078 A1 | 5/2013 | Weik et al. | |
| 2013/0166711 A1* | 6/2013 | Wang | G08B 13/19656 |
| | | | 709/223 |
| 2013/0235215 A1 | 9/2013 | Okada | |
| 2013/0295912 A1 | 11/2013 | Chen | |
| 2013/0336590 A1 | 12/2013 | Sentinelli et al. | |
| 2014/0010517 A1* | 1/2014 | Sheffler | H04N 21/231 |
| | | | 386/226 |
| 2014/0015981 A1 | 1/2014 | Dietl | |
| 2014/0028435 A1 | 1/2014 | Brockway et al. | |
| 2014/0043480 A1* | 2/2014 | Wu | H04N 21/4882 |
| | | | 348/143 |
| 2014/0237493 A1* | 8/2014 | Russo | H04N 21/47217 |
| | | | 725/5 |
| 2014/0300817 A1 | 10/2014 | Bezman et al. | |
| 2014/0347478 A1 | 11/2014 | Cho et al. | |
| 2015/0002665 A1 | 1/2015 | Sentinelli et al. | |
| 2015/0015718 A1 | 1/2015 | Fujimatsu et al. | |
| 2015/0061896 A1 | 3/2015 | Walther et al. | |
| 2015/0085184 A1 | 3/2015 | Vidal et al. | |
| 2015/0213838 A1 | 7/2015 | Dinev et al. | |
| 2015/0334299 A1* | 11/2015 | Tsuneno | H04N 23/661 |
| | | | 348/36 |
| 2015/0350538 A1* | 12/2015 | Hundemer | G06F 16/7867 |
| | | | 348/207.1 |
| 2016/0021390 A1* | 1/2016 | Haimi-Cohen | H04N 7/181 |
| | | | 375/240.24 |
| 2016/0101194 A1 | 4/2016 | Dennis | |
| 2016/0105718 A1 | 4/2016 | Xu et al. | |
| 2016/0127691 A1 | 5/2016 | Bokowski et al. | |
| 2016/0381276 A1 | 12/2016 | Li et al. | |
| 2017/0034483 A1 | 2/2017 | Aghdasi et al. | |
| 2017/0257414 A1 | 9/2017 | Zaletel | |
| 2018/0286239 A1 | 10/2018 | Kaloyeros et al. | |
| 2020/0265693 A1 | 8/2020 | Lindsey et al. | |
| 2020/0275062 A1 | 8/2020 | Yamamoto et al. | |

OTHER PUBLICATIONS

Park, et al., Korean Publication No. 10-2011-0023634, titled "Apparatus for generating thumbnail image and method for displaying thumbnail image", published Mar. 8, 2011, alternative translation provided for arguments in response to office action dated Sep. 27, 2018, 12 pages.

* cited by examiner

DEVICES, SYSTEMS, AND METHODS FOR REMOTE VIDEO RETRIEVAL

CROSS-REFERENCE TO RELATED APPLICATIONS

This application is a continuation of U.S. patent application Ser. No. 16/867,316, filed May 5, 2020, now U.S. Pat. No. 11,495,102, issued Nov. 8, 2022, which is a continuation-in-part of U.S. patent application Ser. No. 14/451,067, filed Aug. 4, 2014, now U.S. Pat. No. 10,645,459, issued May 5, 2020, the disclosure of each of which is hereby incorporated herein in its entirety by this reference.

TECHNICAL FIELD

This disclosure relates generally to camera systems and, more specifically, to methods, devices, and systems for remote, on-demand video retrieval.

BACKGROUND OF RELATED ART

Conventional video surveillance systems are on-premise, vender-specific, and utilize localized digital video recorders (DVR) and/or network video recorders (NVR) with limited accessibility outside of the area in which they are positioned. As digital technology has advanced and Internet protocol (IP) cameras have become widely available, the implementation of these IP-enabled cameras into video surveillance systems has not changed. Camera systems are being implemented at an increasing rate across broad geographical areas, and the need to centralize management as well as to provide secure global access to these disparate camera systems is becoming a critical necessity.

The increased data capabilities of cellular and satellite providers make it possible to place cameras virtually anywhere in the world. However, cellular and satellite connections are metered, making it cost prohibitive to stream large amounts of data intensive video. Additionally, cellular and satellite communication links are capped to ensure bandwidth is available to all customers.

BRIEF SUMMARY

In one specific embodiment, a system may include at least one camera, at least one storage device communicatively coupled and local to the at least one camera, and a communication device communicatively coupled to the at least one storage device. The system may further include a server coupled to the communication device and application program. The application program may be configured to periodically download an image from the at least one camera, enable one or more downloaded images being associated with a known time period to be displayed at an electronic device, and enable video based on a selected downloaded image to be displayed at the electronic device.

In another specific embodiment, a method may include capturing at least one video clip and at least one image with at least one camera at a camera location and periodically downloading one or more images of the at least one image to a remote server. The method may further include enabling video including the at least one video clip and being associated with at least one selected image of the at least one image to be displayed at an electronic device remote from the at least one camera and the server.

Yet other embodiments of the present disclosure comprise computer-readable media storage storing instructions that when executed by a processor cause the processor to perform instructions in accordance with one or more embodiments described herein.

Other aspects, as well as features and advantages of various aspects, of the present disclosure will become apparent to those of skill in the art through consideration of the ensuing description, the accompanying drawings and the appended claims.

DETAILED DESCRIPTION

Referring in general to the accompanying drawings, various embodiments of the present disclosure are illustrated to show the structure and methods for recording and retrieving video with a system, such as a video surveillance system. Common elements of the illustrated embodiments are designated with like numerals. It should be understood that the figures presented are not meant to be illustrative of actual views of any particular portion of the actual device structure, but are merely schematic representations which are employed to more clearly and fully depict embodiments of the disclosure.

The following provides a more detailed description of the present disclosure and various representative embodiments thereof. In this description, functions may be shown in block diagram form in order not to obscure the present disclosure in unnecessary detail. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Figure 1:
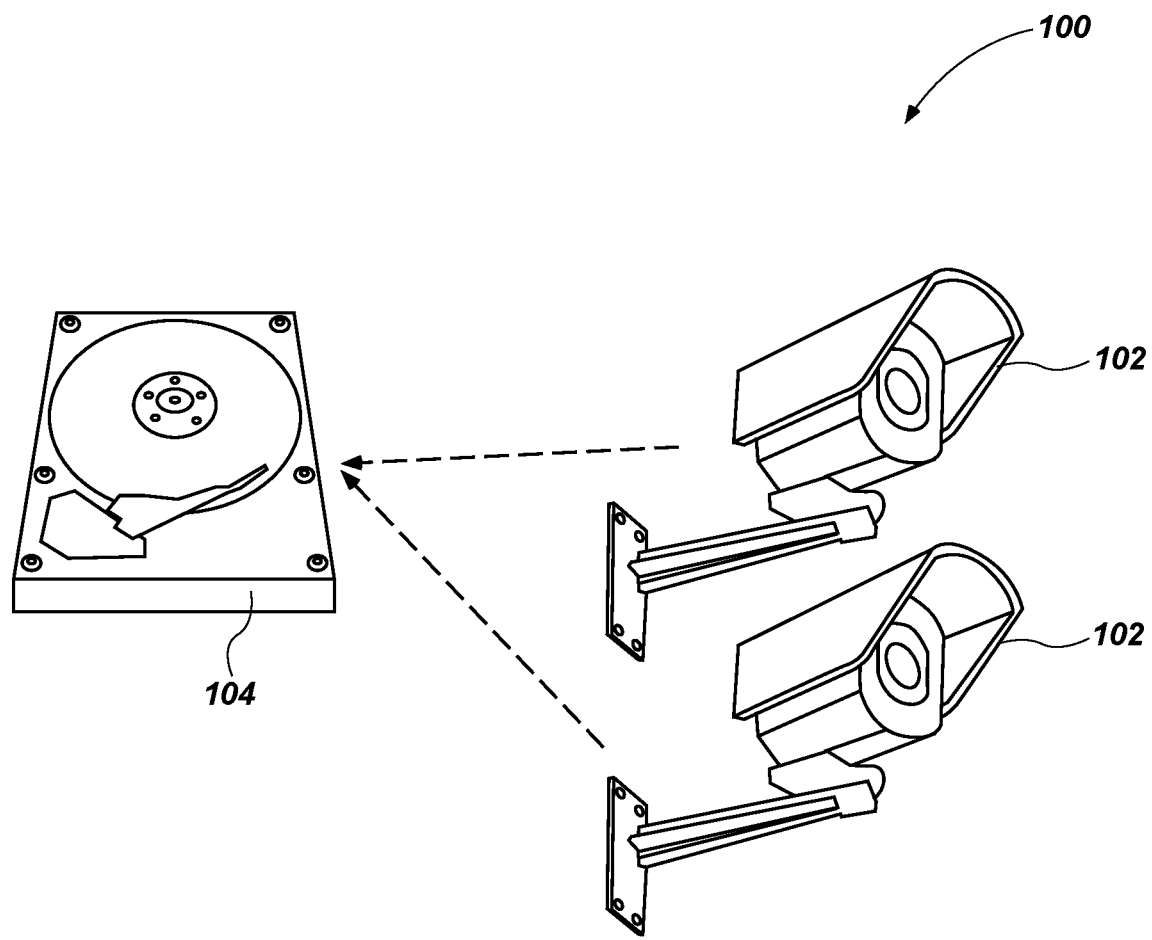
FIG. 1 depicts an onsite camera system including one or more cameras coupled to a storage device.

FIG. 1 depicts an onsite camera system 100 including one or more cameras 102 and a storage device 104, which is in the vicinity of cameras 102. Stated another way, system 100 utilizes onsite data storage. An onsite data storage solution requires storage device 104 (i.e., either a memory card, hard drive, or a digital video recorder (DVR)/network video recorder (NVR) appliance/computer) to be onsite and connected directly to cameras 102. During operation, storage device 104 continuously records video captured by cameras 102 (i.e., 24 hours a day/7 days a week). If a remote user wants to watch any recorded video, the user must travel to onsite camera system 100 and download video footage from storage device 104. This is both time consuming and expensive. In addition, if onsite camera system 100 is off-grid (e.g., powered by wind or solar), storage device 104 may be required to draw significant power requiring additional costly power infrastructure to be installed. If storage device 104 includes a DVR/NVR device, Internet connectivity usually does not work well because Internet enabled DVR/ NVR systems are designed to be connected to broadband connections and require a large amount of bandwidth. Since broadband Internet does not exist in remote locations, remote access to Internet enabled DVR/NVRs is troublesome, if not impossible.

Figure 2:
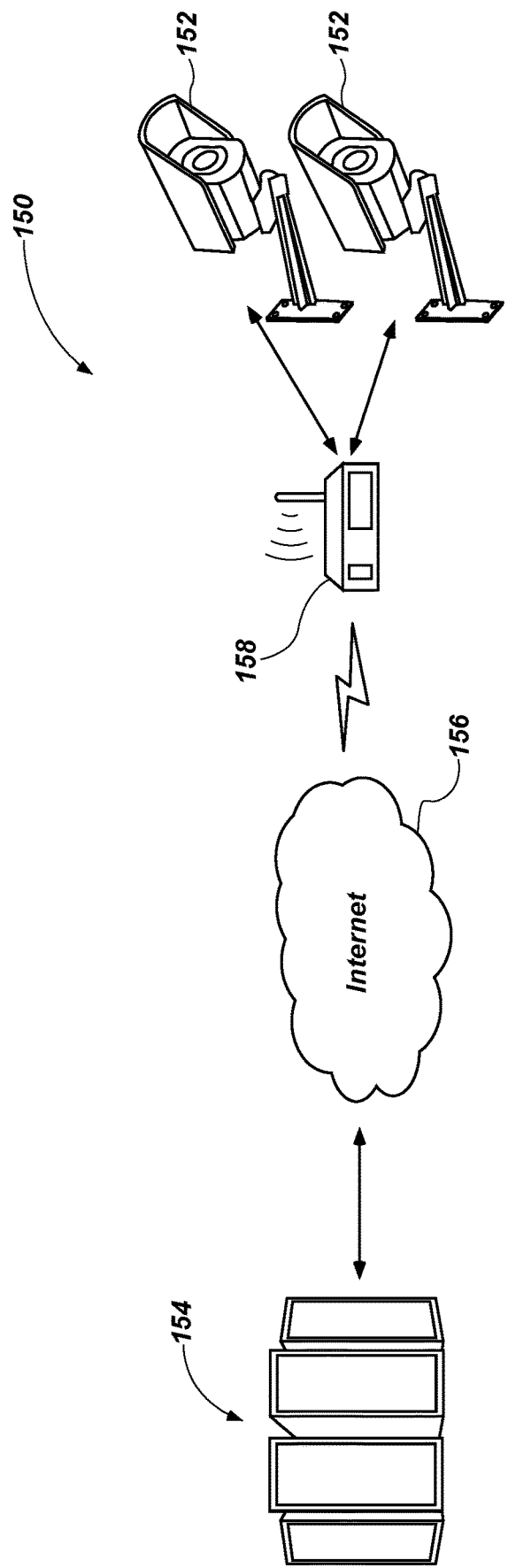
FIG. 2 illustrates a cloud-based camera system.

FIG. 2 depicts a cloud-based camera system 150 including one or more cameras 152 coupled to one or more servers 154 via the Internet 156 and a communication device 158 (i.e., a cellular or satellite modem). Some disadvantages of cloud-based camera systems are poor video quality and expensive monthly communication costs. A cloud-based camera system may require one or more cameras at a remote location to continuously stream video over a metered Internet connection (i.e., 24 hours a day/7 days a week). This constant streaming of video over an Internet connection is very expensive. Further, the bandwidth of the Internet connection is often limited resulting in poor video quality. Another problem with using a cloud-based camera system for a remote camera location is, if the Internet connection is lost, recording may also be lost.

Exemplary embodiments, as described herein, relate to a camera system configured to record video locally rather than across the Internet and provide a way for a user to access any specific portion of the recorded video in an efficient and cost-effective manner. More specifically, various embodiments relate to managing streaming video connections to cameras based on user demand, thus allowing for live video to be streamed economically over metered Internet connections (e.g., cellular and satellite) while limiting data usage (e.g., using less than 2 GB of data a month) compared to conventional solutions, which typically use an average of 32 GB of data a month. Further, embodiments of the present disclosure support configurable bit rates to allow cameras to stream live video over various connection speeds (e.g., as little as 50 Kbs connections and higher).

Figure 3:
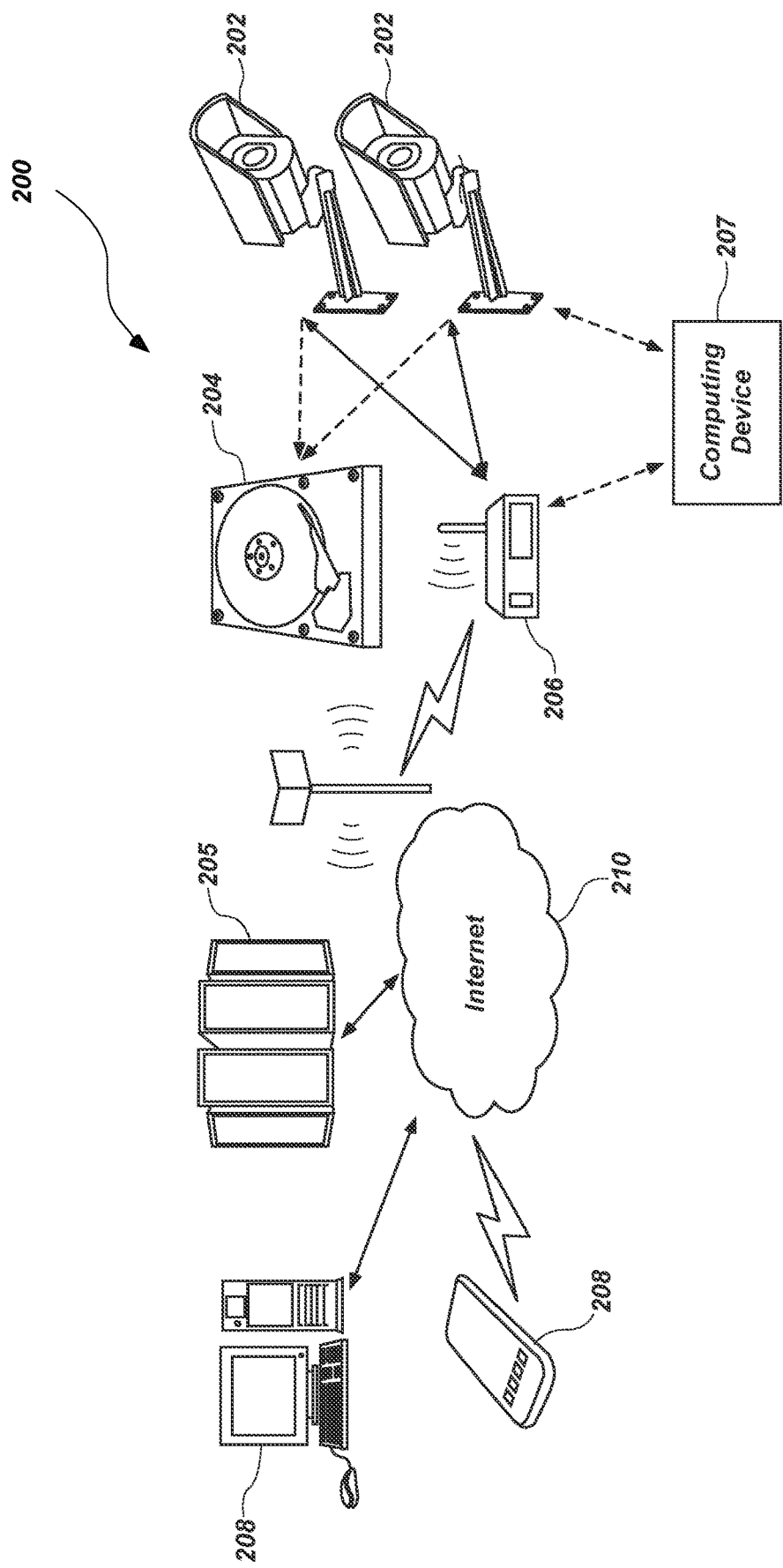
FIG. 3 depicts a system, according to an embodiment of the present disclosure.

FIG. 3 depicts a system 200 in accordance with an embodiment of the present disclosure. System 200, which may also be referred to as a "video camera system," includes one or more cameras 202, each of which being communicatively coupled to one or more local storage devices 204. Local storage device 204, which may comprise, for example only, internal flash media, a network attached storage device, or any other suitable electronic storage device, may be configured for receiving and storing data (e.g., video, images, and/or i-frames) captured by camera 202. As will be understood by a person having ordinary skill in the art, an amount of time that can be recorded by local storage device 204 may be a function of a size of the memory of local storage device 204 and the bitrate (quality and frame-rate) at which the recording is saved. It is noted that storage device 204, and a recording format and encoding performed by local storage device 204, may be dependent on the type of camera 202. Local storage device 204 may include a finite amount of memory; thus, according to one embodiment, video recording may be handled as first in first out (FIFO) and the oldest recordings may be overwritten when memory of local storage device 204 is full.

System 200 may further include one or more electronic devices 208, which may comprise, for example only, a mobile device (e.g., mobile phone, tablet, etc.), a desktop computer, or any other suitable electronic device including a display. Electronic device 208 may be accessible to one or more end-users. A communication device (e.g., a modem) 206, which may comprise any suitable and known communication device, may be coupled to local storage device 204, and possibly cameras 202, via wired connections, wireless connections, or a combination thereof. Communication device 206 may further be coupled to electronic devices 208 via the Internet 210. System 200 may further include a server 205 (e.g., a cloud server), which is remote from cameras 202 and which is communicatively coupled to each electronic device 208 and each communication device 206. According to various embodiments of the present disclosure, camera 202, local storage device 204, and communication device 206 may be within a first location (a "camera location"), and server 205 may be within a second location, remote from the camera location. In addition, each electronic device 208 may be remote from the camera location and server 205. As will be appreciated by a person having ordinary skill in the art, system 200 is modular, expandable, and scalable.

Figure 4:
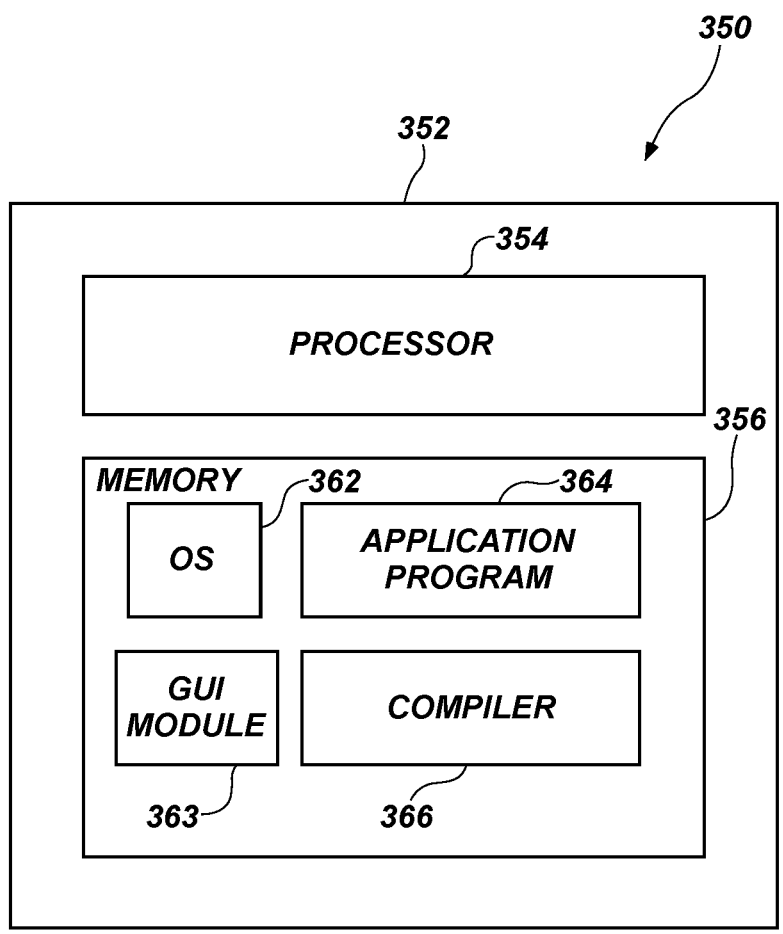
FIG. 4 is a block diagram of a system for implementing various embodiments of the present disclosure.

FIG. 4 illustrates a system 350 that may be used to implement embodiments of the present disclosure. System 350 may include a computer 352 that comprises a processor 354 and memory 356. For example only, and not by way of limitation, computer 352 may comprise a workstation, a laptop, or a hand-held device such as a cell phone or a personal digital assistant (PDA), a server (e.g., server 205) or any other processor-based device known in the art. In one embodiment, computer 352 may be operably coupled to a display (not shown in FIG. 4), which presents images to the user via a GUI.

Generally, computer 352 may operate under control of an operating system 362 stored in the memory 356, and interface with a user to accept inputs and commands and to present outputs through a GUI module 363. Although GUI module 363 is depicted as a separate module, the instructions performing the GUI functions may be resident or distributed in the operating system 362, an application program 364, or implemented with special purpose memory and processors. Computer 352 may also implement a compiler 366 that allows application program 364 written in a programming language to be translated into processor 354 readable code. After completion, application program 364 may access and manipulate data stored in the memory 356 of the computer 352 using the relationships and logic that are generated using the compiler 366.

Further, operating system 362 and application program 364 may include instructions that, when read and executed by the computer 352, may cause the computer 352 to perform the steps necessary to implement and/or use embodiments of the present disclosure. Application program 364 and/or operating instructions may also be tangibly embodied in memory 356 and/or data communications devices, thereby making a computer program product or article of manufacture according to an embodiment of the present disclosure. As such, the term "application program" as used herein is intended to encompass a computer program accessible from any computer readable device or media. Application program 364 may exist on an electronic device (e.g., electronic device 208; see FIG. 3) or a server (e.g., server 205; see FIG. 3). Furthermore, portions of application program 364 may be distributed such that some of application program 364 may be included on a computer readable media within an electronic device (e.g., electronic device 208) and some of application program 364 may be included on a server (e.g., server 205). In other embodiments, application program 364 may be configured to run on electronic device 208, server 205, storage device 204, communication device 206, another computing device 207 (see FIG. 3), or any combination thereof. As a specific example, application program 364 may exist on server 205 and may be accessible to an end-user via an electronic device 208.

Figure 5:
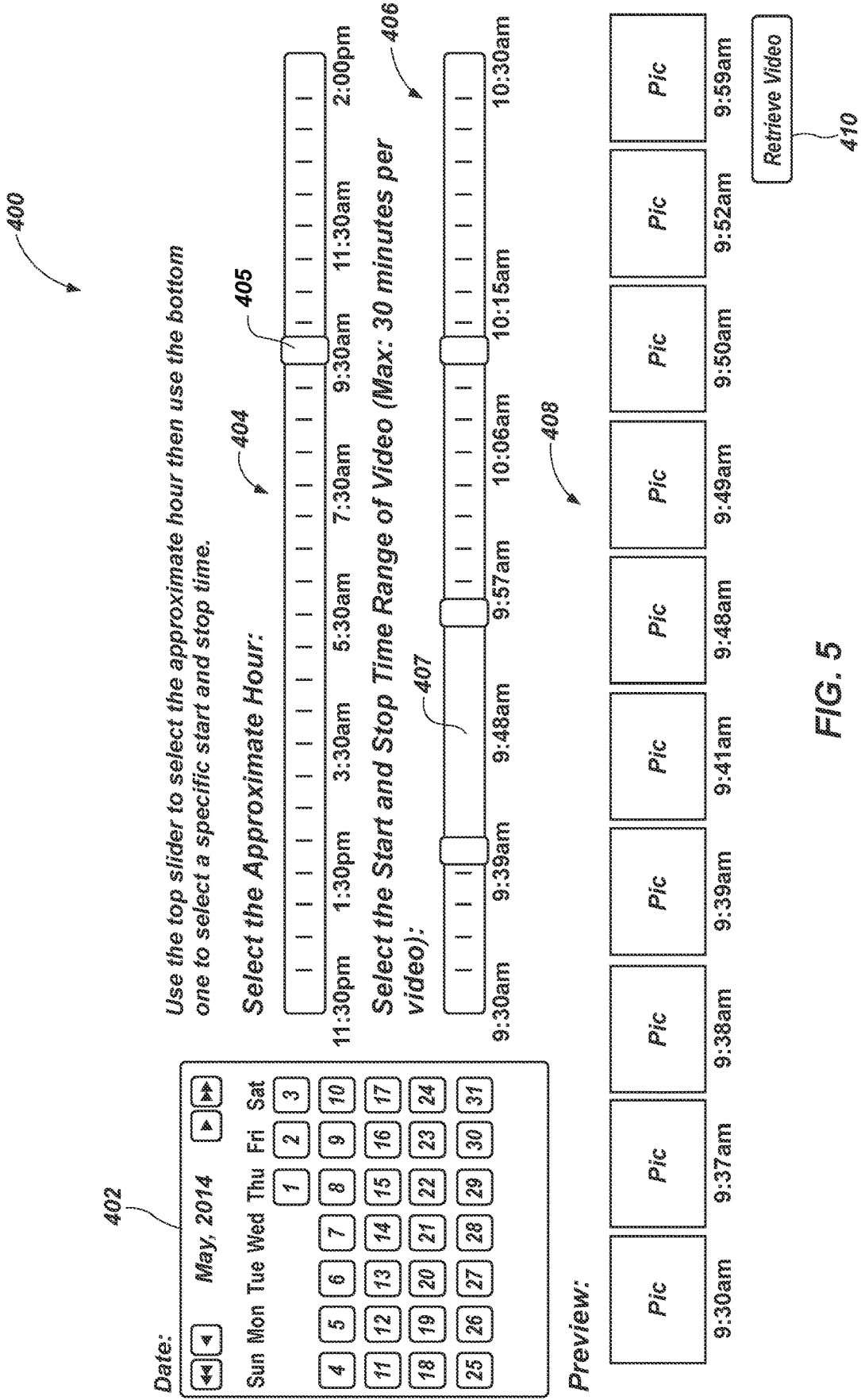
FIG. 5 is a screenshot illustrating a graphical user interface (GUI) generated by an application program, in accordance with an embodiment of the present disclosure.

With reference to FIGS. 3-5, a contemplated operation of system 200 will now be described. During operation, camera 202 may be configured to capture and convey video to local storage device 204 continuously, or according to either a defined schedule or an event, such as motion detected or a sensor being activated. It is noted that video stored on local storage device 204 may be stored a different bitrate (e.g., usually higher) than live video streaming bitrates over Internet 210 through relay server 205 and on to electronic device 208. Further, camera 202 may be configured to periodically capture and convey a snapshot image and/or an i-frame to server 205, which may be configured for storing one or more time-stamped snapshot images and/or i-frames. Alternatively, server 205 may be configured to capture and retrieve data (e.g., a snapshot image and/or an i-frame) from camera 202. Further, a user may access server 205 and view the data (e.g., one or more time-stamped snapshot images and/or one or more i-frames). The data (e.g., time-stamped snapshot images and/or i-frames) may be used by the user in deciding a date and time range of interest for viewing one or more videos. More specifically, a user may interact with electronic device 208 and more specifically, a user interface (e.g., a graphical user interface (GUI)) of electronic device 208 that displays data (e.g., previously saved time-stamped images and/or i-fames) and allows the user to request video to be downloaded from local storage device 204 by selecting a date and time range. Accordingly, system 200 may provide an end-user with access to data (e.g., both still images, i-frames, as well as to archived video footage). The end-user may select a day and an approximate time, and application program 364 can access and display all data (e.g., preset images and/or i-frames). Further, an end-user, from any computer and any location, can select, via application program 364, one or more images to access archived video footage from any computer and any location.

In at least one embodiment, (e.g., instead of sending pictures to server 205), one or more i-frames at the nearest date and time of interest may be sent (e.g., in real-time) from camera 202 to server 205 and/or electronic device 208 to provide more granular visibility of what might be recorded. In other words, sending discreet frames (e.g., instead of pictures) to help users find content of interest by moving a selection component (e.g., a slider) that shows frames closest to that time. This may provide a way to scrub video using limited data while providing what looks like the video stored in server 205.

In one contemplated operation, a user may request a video clip that includes a portion of a video clip that was already downloaded from a previous request. In this case, to reduce data consumption, at least a portion of the previously downloaded video clip may be used. Further, in some embodiments, the previously downloaded video clip may be combined with a newly downloaded video clip to fulfill the end-users video clip request. In other words, cache portions of video that were previously downloaded may be used with new portions (i.e., recently downloaded clips) of video that overlap with that the time frame identified by the user. Further, it is noted that a user request does not necessarily need to be a date/time stamp generated request. Rather, for example, a request may include an offset of a time or frame number. Any data to indicate date/time region may be used to identify and/or retrieve video.

FIG. 5 is a screenshot 400 illustrating a graphical user interface (GUI) configured for displaying saved, time-stamped images. The images may enable a user to request video to be downloaded by selecting a date and, possibly, a time range. More specifically, as illustrated, the GUI includes a calendar display 402 for selecting a desired month and day. Further, the GUI includes a scale 404 and a selection component (e.g., a slider) 405 for selecting an approximate hour and a scale 406 and selection component for selecting a specific start and stop time of the selected hour. In addition, the GUI includes a plurality of images 408, which are labeled as being captured at specific times between the start and stop times selected by selection component 407. The GUI further includes an icon 410, which, upon selection by a user, may cause a video associated with a selected image and/or a date/time range to be downloaded. Based on a video request made by a user, application program 364 may communicate with camera 202 and/or storage device 204 and may search for and download all videos on camera 202 and/or storage device 204 from within the specified date/time range from local storage device 204 to a server (e.g., server 205). Application program 364 may communicate with camera 202 and/or storage device 204 via, for example, standard protocols, such as HTTP, FTP, SSH, and Telnet, or a device specific application programming interface (API). Each camera 202 or storage device 204 may be different, thus, according to one embodiment, an abstraction layer for communication may be used to allow application program 364 to communicate with each type of camera or storage device.

It is noted that if the application program 364 identifies two or more video clips (i.e., within the specified date/time range), application program 364 may be configured to merge the clips into one continuous clip. Further, application program 364 may also convert the video clip to a video clip (e.g., an internet standard video clip) compatible with all suitable devices, operating systems, and browsers. After a video has been retrieved and processed, application program 364 may publish the video for the end-user to download and notify the end-user when the video is accessible. The retrieved video can be stored in the cloud (e.g., within server 205) for multiple users to view simultaneously and/or can be delivered electronically (e.g., email, SMS/text, and/or ftp the video to a designated server, etc.) to one or more end-users.

It is noted that all pan, tilt, and zoom (PTZ) presets of camera 202 may be controlled via system 200, making it possible for cameras 202 to have a virtually unlimited number of presets that can be managed by any number of authorized end-users without giving explicit access to cameras 202. System 200, and more specifically application program 364, may be configured to store information regarding each camera 202 (e.g., type, location, etc.) and enable users to select cameras from a master list or by a geographical location. Once a user selects a camera, the user may access and control the camera (e.g., pan, tilt, and zoom functionalities) via an electronic device 208 (e.g., any computer or smartphone) and application program 364. Additionally, a user may configure a camera according to one or more presets (e.g., via a preset camera management tool). Further, a user can create new presets that may become a database for archived images. Thus, a camera may operate according to an end-user's presets and capture snapshot images at desired intervals. Additionally, an end-user may manage time-lapse and other archiving functions directly from a preset camera management tool.

System 200 may further be configured for performing user authentication, security, and management features, making it possible for an end-user to manage world-wide networks of, for example, thousands of cameras. System 200 may also include a virtual security barrier between users and cameras 202, ensuring an unprecedented level of security (e.g., security suitable for the highest level of government security).

As will be appreciated, system 200 is hardware agnostic, and, thus, may be compatible with most, if not all, cameras (e.g., IP cameras and CCTV cameras with encoders), network connectivity solutions (e.g., broadband, cellular, satellite, WiFi, etc.), and network topologies (e.g., public, private, private on VPN, etc.). In addition, embodiments of the present disclosure may utilize industry standard compression and transport technologies to ensure compatibility with current and future camera technologies. Further, because system 200 is hardware agnostic and provides a camera management layer to all cameras system-wide, camera hardware that fails can be easily and quickly replaced with the same camera model or different hardware or manufacturer or model, all the while the end-user has the exact same experience viewing and operating the camera. It is noted that system 200 may be configured to convey data (i.e., from one or more cameras 202) to any suitable device anywhere in the world, regardless of the original camera manufacturers supported specifications. This may provide users with an unprecedented level of access to their cameras regardless of where they are or what device they may be using at the time. Further, because system 200 may be compatible with all known and suitable cameras, an end-user's hardware investments may be protected for an extended period beyond support.

In addition, system 200 may include an added layer of system analytics to users (e.g., customers) providing critical real-time data and reports such as user activity including date/time, IP address, device, OS, stream duration, camera control history, camera viewing history, login and logout, as well as number of concurrent viewers per camera, camera up time, system health, etc. According to other embodiments, system 200 may be configured to provide geo-location capabilities for cameras 202, making it possible to map an end-user's camera locations, as well as provide real-time automatic vehicle location (AVL) for live streaming video from mobile units, such as mobile cars, trucks, and/or living beings with cameras. This includes the unique ability to map "bread crumb" images on maps showing precise locations (including pictures) where cameras have been with date/time stamps.

Although the various embodiments have been described with reference to camera systems, the present disclosure is not so limited. Rather, system 200 may include one or more sensors and/or control devices, integrating additional data and control capabilities to camera locations making it easy for users to get additional information and to control other systems from a single interface.

According to one embodiment, application program 364 may include, or may be compatible with, a development (API), which may enable customers to integrate their video camera streams into their own website, without the need to constantly update the website if camera hardware changes, network topologies change, etc., and without worrying about the amount of user load (simultaneous viewers) they will experience.

System 200 may be implemented with industry standard security protocols, and employ measures to ensure secure streaming video portals. By way of example, system 200 may be configured to require user authentication before access is permitted and users may be assigned specific roles (i.e., permissions) within system 200, which allows the user to access and perform specific camera and system operations. User permissions may include functionality relating to viewing camera stream, viewing camera archives, controlling camera presets, controlling camera pan/tilt/zoom/focus features, suspending camera patrol, and managing camera presets. Further, permissions may be granted according to various permission levels. As one example, a user with "administrator user" permissions can create, edit, view, and delete users under their domain. The user can also change user permissions, camera access rights, reset passwords, and access full analytics.

System 200 may provide a user with full administration capability. Thus, a user may manage who has access to one or more cameras, when they have access, and how they have access, including user roles, camera access rights, and password.

System 200 may further utilize industry standard encryption techniques. For example, user access to system 200 may be performed over HTTPS (256-bit SSL encryption), and industry standard encryption may be used to encrypt video/audio streams between cameras and video transcoders and relay servers. Further, industry standard encryption may be used to encrypt video and audio streams between video transcoders and relay servers and to an end-user. Because system 200 may obfuscate the camera, sensor, and data acquisition hardware from the end-user, "hacking" is virtually eliminated because all network assets can be on private (non-public accessible) networks.

Figure 6:
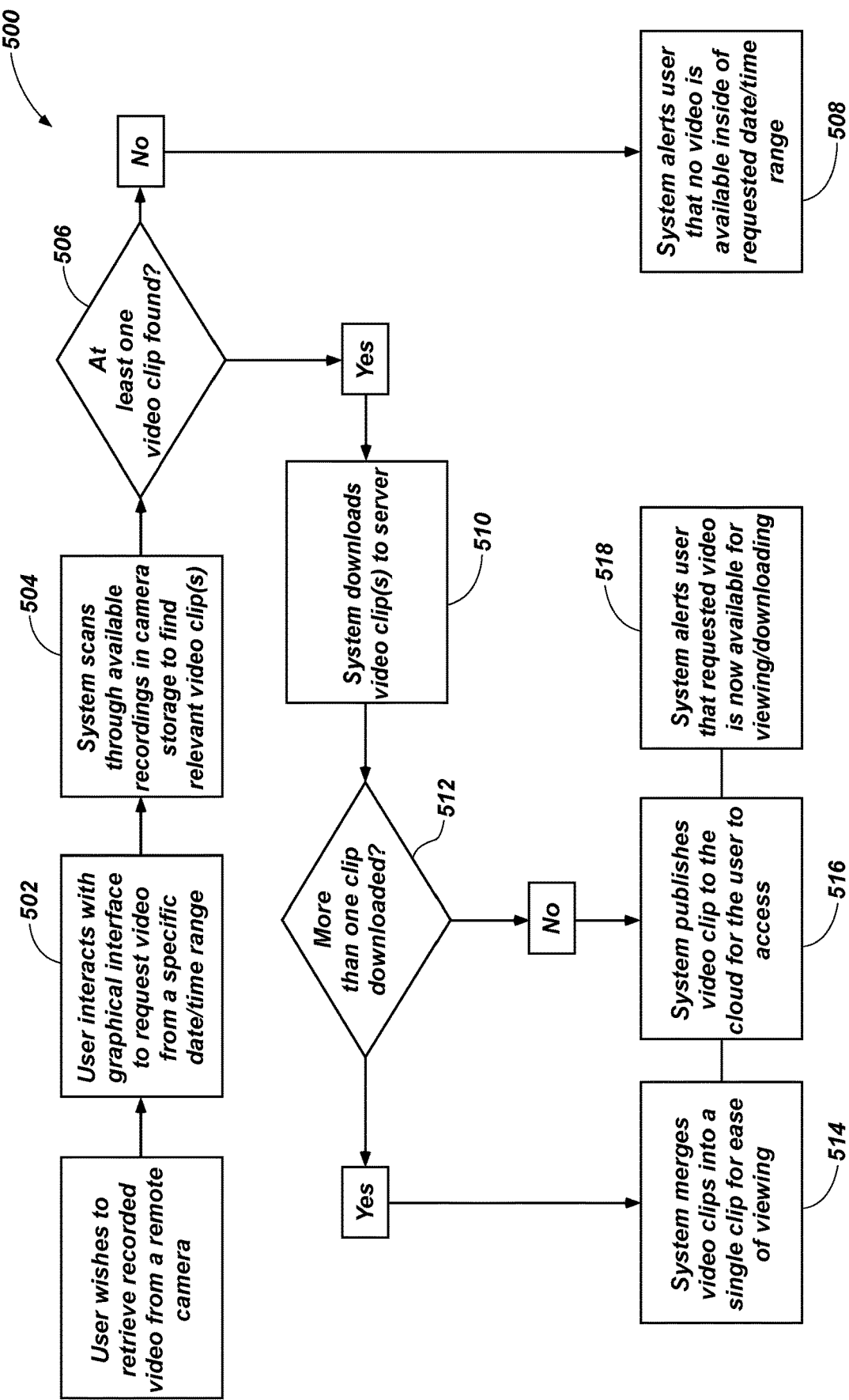
FIG. 6 is a flowchart illustrating a method, according to an embodiment of the present disclosure.

FIG. 6 is a flowchart illustrating a method 500, in accordance with an embodiment of the present disclosure. With reference to FIGS. 3-6, method 500 will now be described. Initially, a user may select a date, and possibly, a time range (depicted by act 502). Further, the user may interact with a GUI to request a video from the selected date and time range (depicted by act 502). In response to a video request, application program 364 may scan through available recordings (i.e., in camera 202 and/or storage device 204) to locate one or more relevant video clips (depicted by act 504). It may then be determined whether at least one video clip is located (depicted by act 506). If no video clips are located, the user may be notified that no video clips exist for the selected date and time range (depicted by act 508). If at least one video clip is located, the at least one video clip may be downloaded to server 205 (depicted by act 510). Moreover, it may be determined if more than one video clip is downloaded (depicted by act 512). If so, the video clips may be merged into a single clip (depicted by act 514) and method may continue to act 516, which includes publishing the single clip for viewing by a user. If only one video clip is downloaded, the video clip may be published for the user to access (depicted by act 516). Furthermore, in act 518, an alert may be provided to the user indicating that the video clip is available for viewing.

Figure 7:
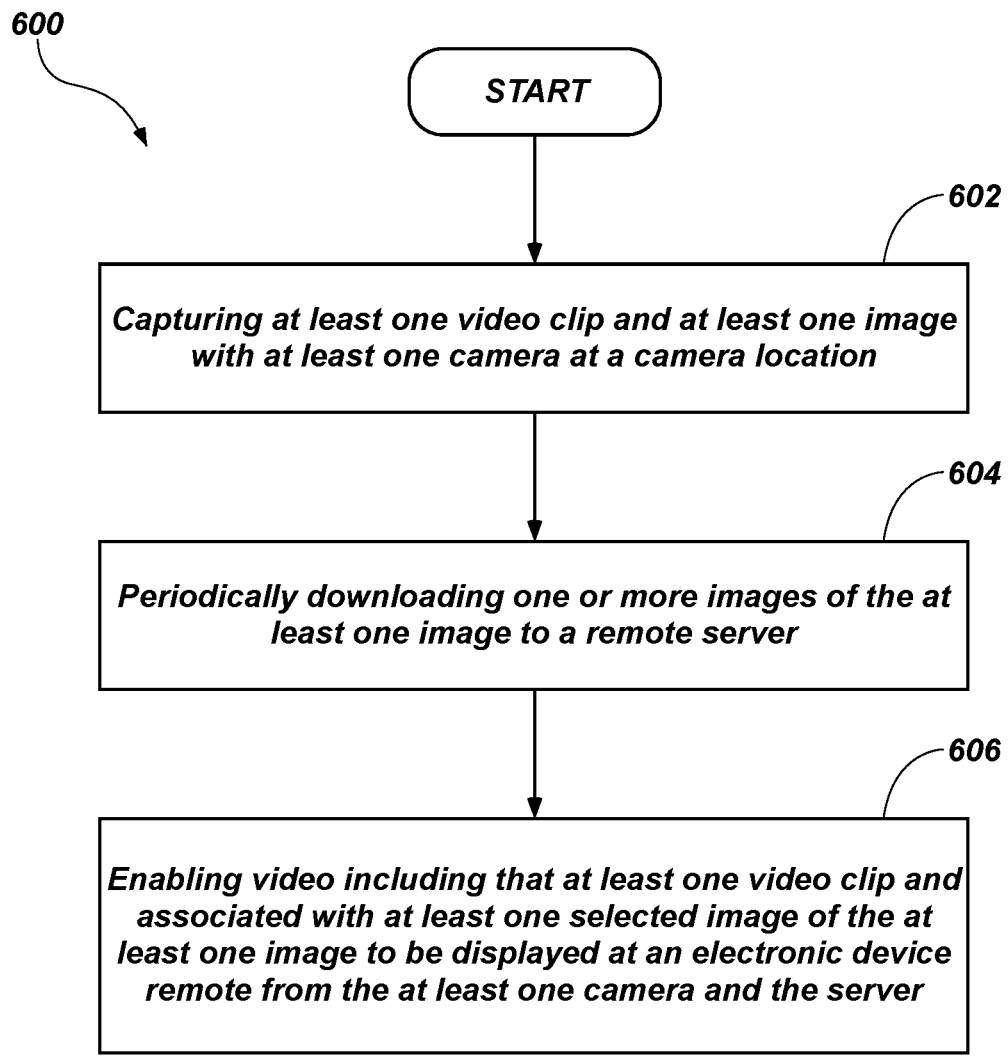
FIG. 7 is a flowchart of another method, in accordance with an embodiment of the present disclosure.

FIG. 7 is a flowchart of a method 600, according to an embodiment of the present disclosure. Method 600 includes capturing at least one video clip and at least one image with at least one camera at a camera location (act 602). Method 600 further includes periodically downloading one or more images of the at least one image to a remote server (act 604). In addition, method 600 includes enabling video including the at least one video clip and being associated with at least one selected image of the at least one image to be displayed at an electronic device remote from the at least one camera and the server (act 606).

As will be appreciated by a person having ordinary skill in the art, embodiments of the present disclosure may not require any costly hardware onsite, thus decreasing implementation costs and monthly communications costs. Further, power requirements to run a remote camera system off-grid may be decreased. By keeping recording local to a camera, system 200 may record video 24 hours a day/7 days a week at high video quality without using any communication data across the cellular or satellite connection. When an "event" occurs that a user is interested in seeing, the user can use an online service portal to request the retrieval of video within the time frame of interest from the remote camera. In this way, only the video data of interest is transmitted over the cellular or satellite connection. The retrieved video may be at a high quality and the cost of transmitting a clip of video is much lower than streaming 24/7 hours a day/7 days a week. Power consumption of the remote camera system will be kept at a minimum because only a camera with a memory card (or low power external hard drive) is needed to record the video.

Although the foregoing description contains many specifics, these should not be construed as limiting the scope of the disclosure or of any of the appended claims, but merely as providing information pertinent to some specific embodiments that may fall within the scopes of the disclosure and the appended claims. Features from different embodiments may be employed in combination. In addition, other embodiments of the disclosure may also be devised which lie within the scopes of the disclosure and the appended claims. The scope of the disclosure is, therefore, indicated and limited only by the appended claims and their legal equivalents. All additions, deletions and modifications to the disclosure, as disclosed herein, that fall within the meaning and scopes of the claims are to be embraced by the claims.

What is claimed:

1. A system, comprising:
   at least one camera at a camera location and configured to record one or more videos and one or more images; and
   an application program configured to:
      download, from the camera location to a cloud device over a metered connection, and store at the cloud device, at least one image of the one or more images captured at the camera location;
      enable the at least one downloaded image to be displayed via an electronic device remote from the camera location; and
      in response to user input associated with a downloaded and displayed image of the at least one downloaded and displayed image and via the electronic device, download, from the camera location to the cloud device over the metered connection, and store at the cloud device, a specific portion of the one or more videos previously captured at the camera location and associated with the downloaded and displayed image.

2. The system of claim 1, further comprising:
   at least one storage device at the camera location and communicatively coupled the at least one camera; and
   a modem at the camera location and communicatively coupled to at least one of the at least one storage device or the at least one camera.

3. The system of claim 1, wherein the application program is configured to enable the electronic device to download the specific portion of the one or more videos.

4. The system of claim 1, wherein the application program is further configured to combine two or more video clips to generate the specific portion of the one or more videos.

5. The system of claim 1, further comprising at least one storage device coupled to the at least one camera.

6. The system of claim 1, the application program further configured to enable a user, via the electronic device, to select a downloaded image based on a specific date and time.

7. A method, comprising:
   recording at least one video clip and one or more images at a camera location;
   downloading, from the camera location to a cloud device over a metered connection, and storing at the cloud device, at least one image of the one or more images without simultaneously downloading the at least one video clip;
   enabling the at least one image to be displayed at an electronic device remote from the camera location; and
   downloading, from the camera location to the cloud device over the metered connection and in response to a request associated with the at least one displayed image, and storing at the cloud device, a previously recorded portion of interest of the at least one video clip, the portion of interest associated with the at least one displayed image.

8. The method of claim 7, wherein downloading the at least one image comprises periodically downloading an image of the at least one image.

9. The method of claim 7, further comprising combining two or more video clips of the portion of interest to generate a single video clip.

10. The method of claim 7, further comprising displaying a user interface (UI) including a calendar, a selection component for selecting a time period, and the at least one image within the selected time period.

11. The method of claim 7, wherein downloading the previously recorded portion of interest comprises downloading the previously recorded portion of interest without downloading all other portions of the at least one video clip from the camera location.

12. The method of claim 7, further comprising enabling the portion of interest to be played at the electronic device.

13. The method of claim 12, wherein enabling the portion of interest to be played comprises causing the portion of interest to be accessible in the cloud.

14. A system, comprising:
   at least one camera at a camera location and configured to capture one or more videos and one or more images;
   the system configured to:
      download, from the camera location to a cloud device over a metered connection, and store at the cloud device, at least one image of the one or more images captured at the camera location;
      enable the at least one downloaded image to be displayed at an electronic device remote from the camera location; and
      in response to a user input associated with a displayed image of the at least one downloaded image, download, from the camera location to the cloud device over the metered connection, and store at the cloud device, a specific portion of the one or more videos captured at the camera location without downloading every other portion of the one or more videos, the specific portion associated with the displayed image.

15. The system of claim 14, further comprising:
   at least one storage device at the camera location and communicatively coupled to the at least one camera; and
   a communication device at the camera location and communicatively coupled to at least one of the at least one storage device or the at least one camera.

16. The system of claim 14, wherein the user input comprises selection of an image of the at least one displayed downloaded image.

17. A system, comprising:

at least one camera at a camera location;

the system configured to:

download, from the camera location to a cloud device over a metered connection, and store at the cloud device, data associated with at least one video captured via the camera;

enable at least a portion of the downloaded data to be displayed via an electronic device; and in response to a user selection related to at least some of the displayed data, download, from the camera location to the cloud device over the metered connection, and store at the cloud device, a specific portion of the at least one video captured at the camera location, the specific portion associated with the at least some of the displayed data.

18. The system of claim 17, wherein the data comprises one or more images captured via the camera.

19. A non-transitory computer readable media configured to store a set of instructions that, when executed by one or more processors, cause a system to perform operations comprising:

download, from a camera location to a cloud device over a metered connection, and store at the cloud device, at least one image of one or more images captured at the camera location;

display, at an electronic device remote from the camera location, the one or more downloaded images; and in response to a user input associated with a displayed image of the one or more downloaded images, download, from the camera location to the cloud device over the metered connection, and store at the cloud device, a specific portion of one or more videos captured at the camera location without downloading every other portion of the one or more videos from the camera location, the specific portion associated with the displayed image.

20. The non-transitory computer readable media of claim 19, wherein the user input comprises a selection of an image of the one or more downloaded images.

* * * * *